United States Patent
Lee et al.

(10) Patent No.: US 9,984,787 B2
(45) Date of Patent: *May 29, 2018

(54) CONDUCTIVE PASTE AND SOLAR CELL

(75) Inventors: Eun-Sung Lee, Seoul (KR); Se-Yun Kim, Seoul (KR); Sang-Soo Jee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 893 days.

This patent is subject to a terminal disclaimer.

(21) Appl. No.: 12/943,732

(22) Filed: Nov. 10, 2010

(65) Prior Publication Data

US 2011/0114170 A1    May 19, 2011

(30) Foreign Application Priority Data

Nov. 11, 2009 (KR) .................. 10-2009-0108674
Oct. 4, 2010  (KR) .................. 10-2010-0096382

(51) Int. Cl.
| | |
|---|---|
| H01B 1/16 | (2006.01) |
| H01B 1/22 | (2006.01) |
| H01L 35/00 | (2006.01) |
| H01L 35/14 | (2006.01) |
| H01L 31/0224 | (2006.01) |

(52) U.S. Cl.
CPC ............ *H01B 1/22* (2013.01); *H01B 1/16* (2013.01); *H01L 31/022425* (2013.01); *H01L 31/022441* (2013.01); *H01L 35/14* (2013.01); *Y02E 10/50* (2013.01)

(58) Field of Classification Search
CPC .... G03G 5/0614; G03G 9/0819; G03G 5/144; B22F 2999/00; H01L 2924/00
USPC ................ 136/252; 252/512, 518.1
See application file for complete search history.

(56) References Cited

U.S. PATENT DOCUMENTS

| | | | | |
|---|---|---|---|---|
| 4,434,084 A | * | 2/1984 | Hicks et al. | 252/512 |
| 4,962,066 A | * | 10/1990 | Starz et al. | 501/19 |
| 5,170,930 A | | 12/1992 | Dolbear et al. | |
| 5,288,344 A | | 2/1994 | Peker et al. | |
| 5,709,958 A | | 1/1998 | Toyoda et al. | |
| 6,027,575 A | | 2/2000 | Paruchuri et al. | |
| 6,420,067 B1 | * | 7/2002 | Yoshioka | 429/218.2 |
| 6,475,664 B1 | | 11/2002 | Kawakami et al. | |

(Continued)

FOREIGN PATENT DOCUMENTS

| | | |
|---|---|---|
| CN | 1287694 A | 3/2001 |
| CN | 1442866 A | 9/2003 |

(Continued)

OTHER PUBLICATIONS

Lin, T., et al, "Effect of Ni on glass-forming ability of Cu—Ti based amorphous alloys," Trans. Nonferrous Met. Soc. China 16 (2006) 604-606.*

(Continued)

*Primary Examiner* — Mark Kopec
(74) *Attorney, Agent, or Firm* — Harness, Dickey & Pierce, P.L.C.

(57) ABSTRACT

Disclosed is a conductive paste including; a conductive powder including a plurality of conductive particles, a metallic glass disposed between adjacent conductive particles of the conductive powder, and an organic vehicle in which the conductive powder and metallic glass are disposed, and a solar cell using the conductive paste.

34 Claims, 7 Drawing Sheets

(56) References Cited

U.S. PATENT DOCUMENTS

| | | | |
|---|---|---|---|
| 7,056,394 | B2 | 6/2006 | Inoue et al. |
| 7,147,727 | B2 | 12/2006 | Kim et al. |
| 7,183,018 | B2 | 2/2007 | Kawakami et al. |
| 7,399,370 | B2 | 7/2008 | Inoue et al. |
| 7,622,011 | B2 | 11/2009 | Inoue et al. |
| 7,947,134 | B2* | 5/2011 | Lohwongwatana et al. .. 148/522 |
| 2002/0036034 | A1 | 3/2002 | Xing et al. |
| 2004/0245507 | A1 | 12/2004 | Nagai et al. |
| 2005/0019203 | A1 | 1/2005 | Saitoh et al. |
| 2005/0211340 | A1 | 9/2005 | Kim et al. |
| 2005/0228097 | A1 | 10/2005 | Zhong |
| 2006/0102228 | A1 | 5/2006 | Sridharan et al. |
| 2007/0031730 | A1 | 2/2007 | Kawakami et al. |
| 2007/0034305 | A1* | 2/2007 | Suh ............................ 148/561 |
| 2007/0072969 | A1 | 3/2007 | Lee et al. |
| 2007/0102676 | A1 | 5/2007 | Lee et al. |
| 2007/0137737 | A1 | 6/2007 | Guo et al. |
| 2007/0157852 | A1 | 7/2007 | Lee et al. |
| 2007/0163646 | A1 | 7/2007 | Kushiya et al. |
| 2008/0196794 | A1 | 8/2008 | Blandin et al. |
| 2009/0056798 | A1 | 3/2009 | Merchant et al. |
| 2009/0101190 | A1* | 4/2009 | Salami et al. ................. 136/244 |
| 2009/0205709 | A1 | 8/2009 | Kim |
| 2009/0211626 | A1* | 8/2009 | Akimoto ....................... 136/252 |
| 2009/0246410 | A1 | 10/2009 | Cao et al. |
| 2009/0250106 | A1 | 10/2009 | Hayashi et al. |
| 2009/0283131 | A1 | 11/2009 | Kushiya et al. |
| 2009/0298283 | A1 | 12/2009 | Akimoto et al. |
| 2010/0037990 | A1 | 2/2010 | Suh |
| 2010/0096014 | A1 | 4/2010 | Iida et al. |
| 2010/0098840 | A1 | 4/2010 | Du et al. |
| 2010/0101637 | A1 | 4/2010 | Yamasaki et al. |
| 2011/0162687 | A1 | 7/2011 | Moon et al. |
| 2012/0031481 | A1 | 2/2012 | Jee et al. |
| 2012/0037221 | A1 | 2/2012 | Kim et al. |
| 2012/0103409 | A1 | 5/2012 | Kim et al. |
| 2014/0349442 | A1 | 11/2014 | Kim |

FOREIGN PATENT DOCUMENTS

| | | |
|---|---|---|
| CN | 102376379 A | 3/2012 |
| EP | 1039 568 B1 | 9/1999 |
| JP | 62-062870 | 3/1987 |
| JP | 10144139 | 5/1998 |
| JP | 2000-311681 A | 11/2000 |
| JP | 2002-080902 A | 3/2002 |
| JP | 2003-013103 A | 1/2003 |
| JP | 2003003246 | 1/2003 |
| JP | 2004091868 | 3/2004 |
| JP | 2005050983 | 2/2005 |
| JP | 2008010527 | 1/2008 |
| JP | 2009-099371 | 5/2009 |
| JP | 2009-138266 | 6/2009 |
| JP | 2009197323 | 9/2009 |
| JP | 2010-018878 | 1/2010 |
| JP | 2010133021 | 6/2010 |
| JP | 2010199196 | 9/2010 |
| JP | 2002298651 | 10/2012 |
| KR | 10-2002-0037772 | 5/2002 |
| KR | 1020050087249 | 8/2005 |
| KR | 1020050096258 | 10/2005 |
| KR | 2007-0004593 A | 1/2007 |
| KR | 100677805 | 1/2007 |
| KR | 1020070106887 | 11/2007 |
| KR | 2009-0089944 A | 8/2009 |
| WO | WO0131085 | 5/2001 |
| WO | 2005096320 | 10/2005 |
| WO | WO-2005/096320 A2 | 10/2005 |
| WO | WO2009108675 | 9/2009 |
| WO | WO 2010033281 | 3/2010 |

OTHER PUBLICATIONS

NIST, Properties of Lead-Free Solders, Release 4.0, Feb. 2002.*
Reda, I. M., et al., "Amorphous Cu—Ag Films With High Stability," International Centre for Theoretical Physics, 1982.*
Partial European Search Report for application No. 10190652.7-2102 dated Mar. 23, 2011.
Mohamed M. Hilali, et al. "Effect of Ag Particle Size in Thick-Film Ag Paste on the Electrical and Physical Properties of Screen Printed Contacts and Silicon Solar Cells", Journal of the Electrochemical Society, 2006, pp. A5-A11, vol. 153, Sec. 1, The Electrochemical Society Inc.
Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.
Se Yun Kim et al. "Replacement of oxide glass with metallic glass for Ag screen printing metallization on Si emitter," App. Phys. Lett., Am. Inst. Phys., vol. 98, No. 222112 Jun. 3, 02011).
ASM Handbook. vol. 3 Alloy Phase Diagrams, The Materials Information Soc., Hugh Baker, Ed., ASM International (1992).
Schubert, G. et al., "Silver thick film contact formation on lowly doped phosphorous emitters", 2005, Proceedings 20th EPVSEC, Barcelona, pp. 934-937.
Wang X et al.: "Atomic structure and glass forming ability of $Cu_{46}Zr_{46}A_{18}$ bulk metallic glass", J. Appl. Phys. 104, 093519 (2008).
European Search Report for 11176323.1-1218 dated Dec. 20, 2011.
European Search Report for 11177515.1-1218 dated Feb. 5, 2013.
Kim S J et al: "Silver/metallic glass paste for shallow emitter Si-solar cell", 26th European Photovoltaic Solar Energy Conference and Exhibition, Sep. 5-9, 2011, pp. 492-494, XP009160654.
Lee S-W et al: "Design of a bulk amorphous alloy containing Cu—Zr with simultaneous improvement in glass-forming ability and plasticity", Journal of Materials Research, vol. 22, No. 02, Feb. 2007, pp. 486-492, XP55031306.
Kim Y C et al: "Enhanced glass of forming ability and mechanical properties of new Cu-based bulk metallic glasses", Materials Science and Engineering A: Structural Materials: Properties, Microstructure & Processing, Lausanne, CH, vol. 437, No. 2, Nov. 15, 2006, pp. 248-253, XP027953056.
Neuhaus D-H et al: "Industrial Silicon Wafer Solar Cells", Advance in Optoelectronics, vol. 2007, XP 55031298.
Bashev V F et al: "Crystallization of Al—Ni alloys during rapid cooling", Russian Metallurgy, Allerton Press, Inc, No. 6, 1989, pp. 51-54, XP009160582.
Ivanov E et al: "Synthesis of nickel aluminides by mechanical alloying", Materials Letters, North-Holland Publishing Company, Amsterdam, NL, vol. 7, No. 1-2, Aug. 1988, pp. 51-54, XP024149792.
Lim S S et al: "Assessment of the Al—Ag Binary Phase Diagram", CALPHAD, vol. 19, No. 2, 1995, pp. 131-141, XP55017954.
Wang Q et al: "Cluster line criterion and Cu—Zr—Al bulk metallic glass formation", Materials Science and Engineering A: Structural Materials: Properties, Microstructure & Processing, Lausanne, CH, vol. 449-451, Mar. 19, 2007, pp. 18-23, XP005914563.
Metallurgy Division of the Materials Science and Engineering Laboratory of NIST: "Ag—Cu—Sn System", Aug. 5, 2010, XP55031251, Retrieved from the Internet: http://web.archive.orq/web/20100805072225/http://www.metallurgy.nist.gov/phase/solder/agcusn.html.
Oh C-S et al: "A thermodynamic study on the Ag—Sb—Sn system", Journal of alloys and compounds, elsevier sequoia, lausanne, CH, vol. 238, May 1, 1996, pp. 155-166, XP004080478.
Baren M R: "Ag—In (Silver-Indium)" In: White C E T, Okamoto H (Editors): "Phase Diagrams of Indium Alloys and their engineering applications", 1992, ASM International, Materials Park, XP008098250.
Gorshkov N N et al: "Explosive compaction of amorphous Cu—Sn powder prepared by the method of mechanical alloying", Combustion, Explosion, and shock waves, vol. 25, No. 2, 1989, pp. 244-247.
Salkar R A et al: "The sonochemical preparation of amorphous silver nanoparticles", Journal of materials chemistry, vol. 9, No. 6, 1999, pp. 1333-1335.

(56) References Cited

OTHER PUBLICATIONS

"Amorphous metal", Wikipedia, Oct. 21, 2010, XP55017848, Retrieved from the internet: URL: http://en.wikipedia.org/w/index.php?title=amorphous_metal&oldid=392080524.
"Electrical resistivity of pure metals" in: "CRC Handbook of chemistry and physics, 77th edition", 1996, CRC Press, Boca raton, New york, London, Tokyo, XP002668350.
Powell et al., Development of metallic glass loaded polymer paste, J. of Materials Processing Tech., 2001, pp. 318-323.
U.S. Office Action dated Dec. 10, 2012 corresponding to U.S. Appl. No. 13/016,403.
U.S. Office Action dated May 15, 2013 corresponding to U.S. Appl. No. 13/016,403.
U.S. Office Action dated Aug. 23, 2013 corresponding to U.S. Appl. No. 13/016,403.
U.S. Office Action dated Oct. 8, 2013 corresponding to U.S. Appl. No. 13/281,835.
Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).
Don-Ik Lee, et al., "Synthesis and Characterization of TRITON™ X-Based Surfactants with Carboxylic or Amino Groups in the Oxyethylene Chain End", Journal of Applied Polymer Science, vol. 104, 162-170 (2007).
M. Chen, "A brief overview of bulk metallic glasses", NPG Asia Materials, vol. 3, Step. 2011, pp. 82-90.
Yi, S. et al. "Ni-based bulk amorphous alloys in the Ni—Ti—Zr—(Si,Sn) system"; Journal of Materials Research, vol. 15, No. 11, p. 2425-2430; Nov. 2000.
Wang, W. "Roles of minor additions in formation and properties of bulk metallic glasses" Progress in Materials Science, vol. 52 p. 540-596; 2007.
U.S. Appl. No. 13/016,403, filed Jan. 28, 2011.
U.S. Appl. No. 13/208,705, filed Aug. 12, 2011.
U.S. Appl. No. 13/307,932, filed Nov. 30, 2011.
U.S. Appl. No. 13/281,835, filed Oct. 26, 2011.
U.S. Appl. No. 13/348,169. filed Jan. 11, 2012.
U.S. Appl. No. 13/759,475, filed Feb. 5, 2013.
U.S. Appl. No. 13/206,880, filed Aug. 10, 2011.
Kenneth Barbalace. Periodic Table of Elements—Sorted by Atomic Radius. EnvironmentalChemistry.com. 1995 http://EnvironmentalChemistry.com/yogi/periodic/atomicradius.html.
U.S. Office Action dated Jan. 31, 2014 corresponding to U.S. Appl. No. 13/348,169.
U.S. Office Action dated Feb. 5, 2014 corresponding to U.S. Appl. No. 13/307,932.
Japanese Office Action dated Apr. 1, 2014 for corresponding application No. JP 2010-252993.
Final Office Action for corresponding U.S. Appl. No. 13/206,880 dated Oct. 14, 2014.
Notice of Allowance dated Dec. 29, 2014 in related U.S. Appl. No. 13/206,880.
Chinese Publication dated Jan. 13, 2016 issued in corresponding Chinese Patent Application No. 201110330645.3 (English translation provided).
U.S. Office Action dated Jan. 15, 2016 issued in co-pending U.S. Appl. No. 13/759,475.
Louzguine-Luzgin, et al. Formation, Structure, and Crystallization Behavior of Cu-Based Bulk Glass-Forming Alloys, Metallurgical and Materials Transactions, vol. 41A, pp. 1664-1669 (2010).
Korean Office Action dated Oct. 5, 2016 issued in corresponding Korean Patent Application No. 10-2010-0075697 (English translation provided).
Korean Office Action dated Jan. 23, 2017 issued in corresponding Korean Patent Application No. 10-2010-0096382 (English translation provided).
U.S. Office Action dated May 25, 2016 issued in co-pending U.S. Appl. No. 13/759,475.
U.S. Office Action dated Nov. 9, 2016 issued in co-pending U.S. Appl. No. 13/759,475.

* cited by examiner

US 9,984,787 B2

CONDUCTIVE PASTE AND SOLAR CELL

This application claims priority to Korean Patent Application No. 10-2009-0108674, filed on Nov. 11, 2009, and Korean Patent Application No. 10-2010-0096382, filed on Oct. 4, 2010, and all the benefits accruing therefrom under 35 U.S.C. § 119, the contents of which in their entirety are herein incorporated by reference.

BACKGROUND OF THE INVENTION

1. Field of the Invention

This disclosure relates to a conductive paste and a solar cell utilizing the same.

2. Description of the Related Art

A solar cell is a photoelectric conversion device that transforms photonic energy, e.g., solar energy, into electrical energy, and it has attracted much attention as a renewable and pollution-free next generation energy source.

A solar cell typically includes p-type and n-type semiconductors and produces electrical energy by transferring electrons and holes to the n-type and p-type semiconductors, respectively, and then collecting the electrons and holes in each of a pair of oppositely disposed electrodes, when an electron-hole pair ("EHP") including electron and hole charge carries is produced by the absorption of solar light energy in a photoactive layer inside the semiconductors.

Furthermore, it is typically beneficial for a solar cell to be as efficient as possible for producing electrical energy from solar energy. In order to improve solar energy conversion efficiency, the solar cell may be able to effectively absorb light with little loss so that it may produce as many electron-hole pairs as possible, and then collect the produced charges without losses of the electrons or holes.

Furthermore, an electrode of a solar cell may be fabricated by screen printing using a conductive paste.

BRIEF SUMMARY OF THE DISCLOSURE

One aspect of the present invention provides a conductive paste that may reduce loss of electrical charges and improve efficiency of a solar cell.

Another aspect of the present invention provides a solar cell using the conductive paste.

According to one aspect, a conductive paste including; a conductive powder including a plurality of conductive particles, a metallic glass disposed between adjacent conductive particles of the conductive powder, and an organic vehicle in which the conductive powder and metallic glass are disposed is provided.

In one exemplary embodiment, the metallic glass may include at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), or a combination thereof.

In one exemplary embodiment, the metallic glass may include an alloy of copper (Cu), zirconium (Zr), nickel (Ni), iron (Fe), titanium (Ti), magnesium (Mg), or a combination thereof.

In one exemplary embodiment, a glass transition temperature (Tg) of the metallic glass may be lower than an eutectic temperature of silicon and the conductive powder.

In one exemplary embodiment, an eutectic temperature of the conductive powder and the metallic glass may be lower than that of the silicon and the conductive powder.

In one exemplary embodiment, an eutectic temperature of the silicon and the metallic glass may be lower than that of the silicon and the conductive powder.

In one exemplary embodiment, the metallic glass may exist as one of a solid, a supercooled liquid, and a liquid at a sintering temperature of the conductive powder.

In one exemplary embodiment, the conductive powder may include at least one of silver (Ag), aluminum (Al), copper (Cu), nickel (Ni), and a combination thereof.

In one exemplary embodiment, the conductive paste may include about 50 wt % to about 90 wt % of the conductive powder, about 1 wt % to about 20 wt % of the metallic glass, and a remaining amount of the organic vehicle based on a total amount of the conductive paste.

In one exemplary embodiment, the conductive paste may further include glass frit.

In one exemplary embodiment, the conductive paste may include about 50 wt % to about 90 wt % of the conductive powder, about 1 wt % to about 20 wt % of the metallic glass, about 1 wt % to 10 wt % of the glass frit, and a remaining amount of the organic vehicle based on a total amount of the conductive paste.

According to another exemplary embodiment, the solar cell may include a semiconductor layer including a semiconductor material, an electrode including a conductive material electrically connected to the semiconductor layer, and a buffer layer including a metallic glass contacted with the semiconductor layer and the electrode.

In one exemplary embodiment, the buffer layer may be disposed between the semiconductor layer and the electrode.

In one exemplary embodiment, a glass transition temperature of the metallic glass may be lower than the eutectic temperature of the semiconductor material and the conductive material.

In one exemplary embodiment, an eutectic temperature of the conductive powder and the metallic glass may be lower than the eutectic temperature of the semiconductor material and the conductive material.

In one exemplary embodiment, an eutectic temperature of the semiconductor material and the metallic glass may be lower than an eutectic temperature of the semiconductor material and the conductive material.

In one exemplary embodiment, the buffer layer may further include glass frit.

In one exemplary embodiment, the semiconductor material may include silicon.

In one exemplary embodiment, the solar cell may further include a first eutectic layer where the conductive material and the metallic glass are subjected to eutectic melting.

In one exemplary embodiment, the solar cell may further include a second eutectic layer that is disposed between the semiconductor layer and the buffer layer and where the semiconductor material and the metallic glass are subjected to eutectic melting.

In one exemplary embodiment, the second eutectic layer may be where the semiconductor material, the metallic glass, and the glass frit are subjected to eutectic melting.

In one exemplary embodiment, the metallic glass may be an alloy including at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), or a combination thereof.

In one exemplary embodiment, the conductive material may include silver (Ag), aluminum (Al), copper (Cu), nickel (Ni), or a combination thereof.

In one exemplary embodiment, the semiconductor layer may include a p-type layer doped with a p-type impurity and an n-type layer doped with an n-type impurity, the electrode may include a first electrode electrically connected with the p-type layer and a second electrode electrically connected with the n-type layer, and the buffer layer may be disposed at least one of between the p-type layer and the first electrode and the n-type layer and the second electrode.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
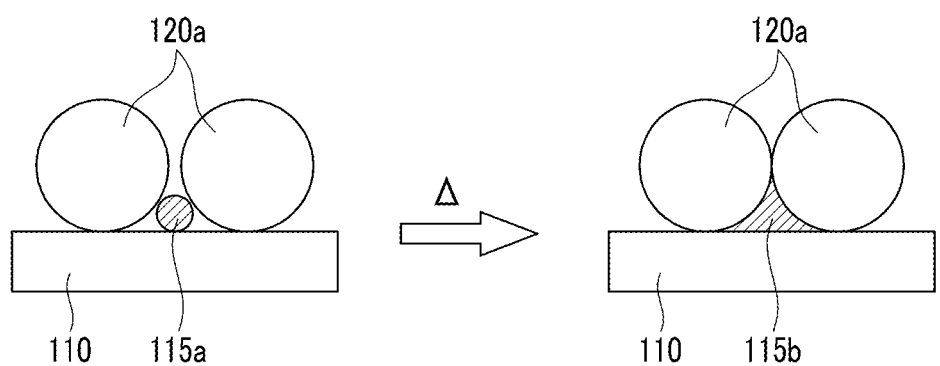
FIGS. 1 and 2 are schematic views of exemplary embodiments showing a conductive powder applied on a semiconductor substrate in an exemplary embodiment of a solar cell according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

First, an exemplary embodiment of a conductive paste according to the present invention will be explained in detail.

According to the present exemplary embodiment, the conductive paste includes a conductive powder, a metallic glass, and an organic vehicle.

The conductive powder includes aluminum (Al), or an aluminum (Al)-containing metal such as an aluminum alloy, silver (Ag), or a silver (Ag)-containing metal such as a silver alloy, copper (Cu), or a copper (Cu)-containing metal such as a copper alloy, nickel (Ni), or a nickel (Ni)-containing metal such as a nickel alloy, a combination thereof or other materials with similar characteristics. Exemplary embodiments include configurations wherein the conductive powder may include other metals, and may include different additives besides the above mentioned metals. In one exemplary embodiment, the conductive powder may have a size of about 0.1 μm to about 50 μm.

The metallic glass includes an alloy having a disordered atomic structure including two or more metals, and is also referred to as an amorphous metal. Since the metallic glass has low resistance that is different from a regular glass such as a silicate, it may be considered an electrical conductor at voltages and currents typically applied to a solar cell.

The metallic glass may be an alloy of transition elements, a noble metal, a rare earth element metal, an alkaline-earth metal, a semimetal, and a combination thereof, and the alloy may include at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), a combination thereof or other materials with similar characteristics.

In one exemplary embodiment, the metallic glass may include at least one selected from copper (Cu), zirconium (Zr), nickel (Ni), iron (Fe), titanium (Ti), magnesium (Mg), and a combination thereof.

Exemplary embodiments of the metallic glass may include $Cu_{50}Zr_{50}$, $Cu_{30}Ag_{30}Zr_{30}Ti_{10}$, $Cu_{43}Zr_{43}Al_7Ag_7$, $Cu_{46}Zr_{46}Al_8$, $Cu_{58.1}Zr_{35.9}Al_6$, $Ti_{50}Ni_{15}Cu_{32}Sn_3$, $Ti_{45}Ni_{15}Cu_{25}Sn_3Be_7Zr_5$, $Ni_{60}Nb_{30}Ta_{10}$, $Ni_{61}Zr_{20}Nb_7Al_4Ta_8$, $Ni_{57.5}Zr_{35}Al_{7.5}$, $Zr_{41.2}Ti_{13.8}Ni_{10}Cu_{12.5}Be_{22.5}$, $Mg_{65}Y_{10}Cu_{15}Ag_5Pd_5$, $Mn_{55}Al_{25}Ni_{20}$, $La_{55}Al_{25}Ni_{10}Cu_{10}$, $Mg_{65}Cu_{7.5}Ni_{7.5}Ag_5Zn_5Gd_{10}$, $Mg_{65}Cu_{15}Ag_{10}Y_6Gd_4$, $Fe_{77}Nb_6B_{17}$, $Fe_{67}Mo_{13}B_{17}Y_3$, $Ca_{65}Mg_{15}Zn_{20}$, $Ca_{66.4}Al_{33.6}$, a combination thereof or other materials with similar characteristics, but is not limited thereto.

The metallic glass may be softened once heated to a glass transition temperature (Tg) or greater, similar to a regular, e.g., non-metallic, glass.

Herein, the glass transition temperature Tg of the metallic glass may be lower than the eutectic temperature of a semiconductor material such as silicon and the conductive powder. Accordingly, the metallic glass may be softened at a temperature lower than the eutectic melting of the semiconductor material and the conductive powder, and therefore the softening may occur prior to eutectic melting of the semiconductor material and the conductive powder during a heating process.

The eutectic temperature of the conductive powder and the metallic glass may be lower than the eutectic temperature of the semiconductor material and the conductive powder. Accordingly, the conductive powder and the metallic glass may be eutectically melted before the eutectic melting of the semiconductor material and the conductive powder during a heating process as described above.

Also, the eutectic temperature of the semiconductor material and the metallic glass may be lower than the eutectic temperature of the semiconductor material and the conductive powder. Accordingly, the semiconductor material and the metallic glass may be eutectically melted before the eutectic melting of the conductive powder and the semiconductor material.

The metallic glass may exist as a solid, a supercooled liquid, or a liquid when heated to a sintering temperature of the conductive powder.

In short, when the conductive paste is applied on the semiconductor layer made of semiconductor material and the temperature is increased, e.g., from a room temperature, the metallic glass is first softened and the softened metallic glass widens an electric charge transfer passage between a semiconductor material and a conductive material by extending a contact area between the semiconductor substrate and a conductive powder. Afterward, the eutectic melting of the metallic glass and the conductive powder, the eutectic melting of the metallic glass and the semiconductor material, and the eutectic melting of the semiconductor material and the conductive powder may be carried out.

The organic vehicle may include an organic compound mixed with a conductive powder and a metallic glass that imparts viscosity to the organic vehicle, and a solvent dissolving the above components.

Exemplary embodiments of the organic compound may include at least one of a (meth)acrylate resin; a cellulose resin such as ethyl cellulose; a phenol resin; an alcohol resin; tetrafluoroethylene (TEFLON); and a combination thereof, and furthermore, it may include an additive such as a surfactant, a thickening agent, a stabilizer and other similar elements.

The solvent may include any kind of solvent as long as it may be soluble with the components.

In one exemplary embodiment, the conductive paste may include about 50 wt % to about 90 wt % of the conductive powder, about 1 wt % to about 20 wt % of the metallic glass, and the balance amount of the conductive paste may be the organic vehicle based on the total amount of the conductive paste.

In one exemplary embodiment, the conductive paste may further include glass frit.

In the embodiment where it is included, the glass frit has an etching property that etches an insulating layer such as anti-reflective layer in a solar cell to penetrate the insulating layer. Accordingly, the conductive paste including the glass frit may be used in a solar cell provided with an anti-reflective layer.

Also, the glass frit may have an excellent adhesion with a lower layer to improve an adhesion between an electrode made of the conductive paste and a lower layer.

Exemplary embodiments of the glass frit may include $PbO$—$SiO_2$, $PbO$—$SiO_2$—$B_2O_3$, $PbO$—$SiO_2$—$B_2O_3$—$ZnO$, $PbO$—$SiO_2$—$B_2O_3$—$BaO$, $PbO$—$SiO_2$—$ZnO$—$BaO$, $ZnO$—$SiO_2$, $ZnO$—$B_2O_3$—$SiO_2$, $ZnO$—$K_2O$—$B_2O_3$—$SiO_2$—$BaO$, $Bi_2O_3$—$SiO_2$, $Bi_2O_3$—$B_2O_3$—$SiO_2$, Bi$_2$O$_3$—B$_2$O$_3$—SiO$_2$—BaO, ZnO—BaO—B$_2$O$_3$—P$_2$O$_5$—Na$_2$O, Bi$_2$O$_3$—B$_2$O$_3$—SiO$_2$—BaO—ZnO, a combination thereof or other materials with similar characteristics.

In an exemplary embodiment wherein the glass frit is included, the conductive paste may include about 50 wt % to about 90 wt % of the conductive powder, about 1 wt % to about 20 wt % of the metallic glass, about 1 wt % to about 10 wt % of the glass frit, and the balance amount of the conductive paste may be the organic vehicle based on the total amount of the conductive paste.

Exemplary embodiments include configurations wherein the conductive paste including the conductive powder, the metallic glass and the organic vehicle may be applied by, for example, screen-printing, when an electrode is formed in various electronic devices. The electronic devices may include a solar cell.

When the electrode is formed in a solar cell, above-mentioned conductive paste may be applied on a semiconductor substrate such as silicon wafer and fired, e.g., heated and dried, to form an electrode.

Hereinafter, an exemplary embodiment of a solar cell will be described with reference to FIGS. 1 and 2.

Figure 2:
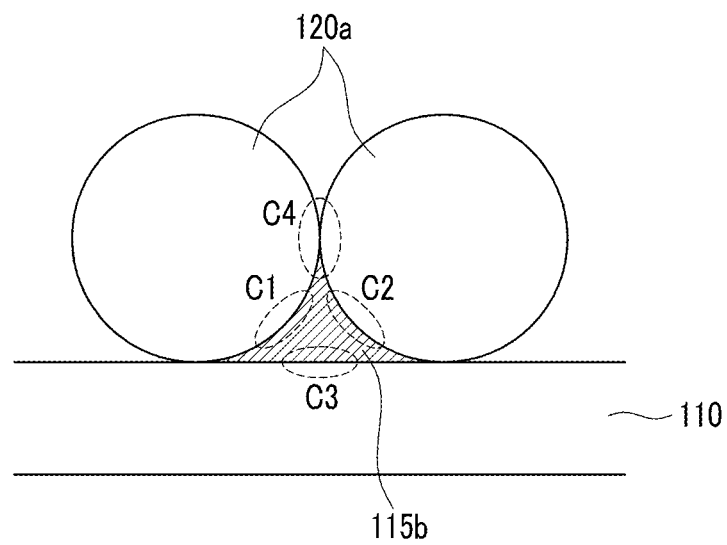

FIGS. 1 and 2 are schematic views of exemplary embodiments showing the conductive paste applied on the semiconductor substrate in one exemplary embodiment of a solar cell according to the present invention. The present invention is not limited to using the conductive paste within a solar cell and may be applied to other applications such as a PDP electrode or an OLED grid electrode.

Referring to FIG. 1, when an exemplary embodiment of a conductive paste according to the present invention is applied on the semiconductor substrate 110, a conductive powder 120a and a metallic glass 115a included in the conductive paste may be present as particles, respectively.

As mentioned above, since a glass transition temperature Tg of the metallic glass 115a is lower than an eutectic temperature of a semiconductor material, such as silicon, and the conductive powder 120a, when the conductive paste is applied on the semiconductor substrate 110 and heat-treated (A) at greater than a glass transition temperature Tg of the metallic glass 115a, the metallic glass 115a may be softened to fill the gap between a plurality of conductive powder 120a particles and the semiconductor substrate 110, to form a softened metallic glass 115b, as shown in FIG. 1.

Referring to FIG. 2, the softened metallic glass 115b may provide contact portions C1 and C2 with the conductive powder 120a, a contact portion C3 with a semiconductor substrate 110, and a contact portion C4 between neighboring particles of the conductive powder 120a to increase close contacting properties therebetween. The softened metallic glass closely contacts the conductive powder 120a and the semiconductor substrate 110, and thereby may provide a path for transferring electric charges generated by the semiconductor substrate 110 to the conductive powder 120a. That is, the distance between the conductive powders 120a particles or between the conductive powder 120a particles and the semiconductor substrate 110 is minimal.

The softened metallic glass 115b may be formed as a buffer layer on the semiconductor substrate 110.

Hereinafter, the formation of the softened metallic glass 115b as a buffer layer on the semiconductor substrate 110 will be described in detail referring to FIGS. 3A to 3E.

FIGS. 3A to 3E are schematic views showing processes of providing a buffer layer on a semiconductor substrate applied with a conductive paste while increasing the temperature thereof.

Figure 3A:
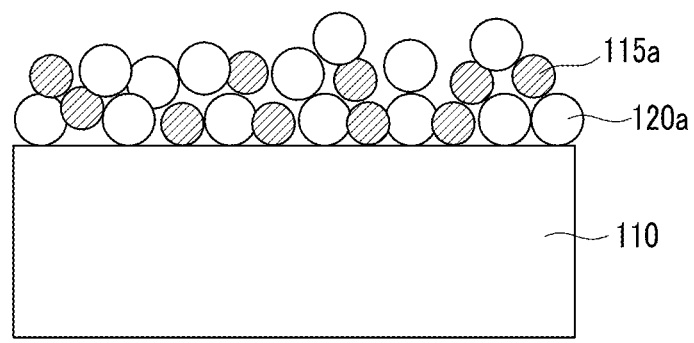
FIGS. 3A to 3F are schematic views showing exemplary embodiments of processes of providing a buffer layer on a semiconductor substrate applied with a conductive paste while increasing the temperature thereof.

Referring to FIG. 3A, a conductive paste including the conductive powder 120a and the metallic glass 115a (here, the illustration of the organic vehicle is omitted) is applied on a semiconductor substrate 110.

Figure 3B:
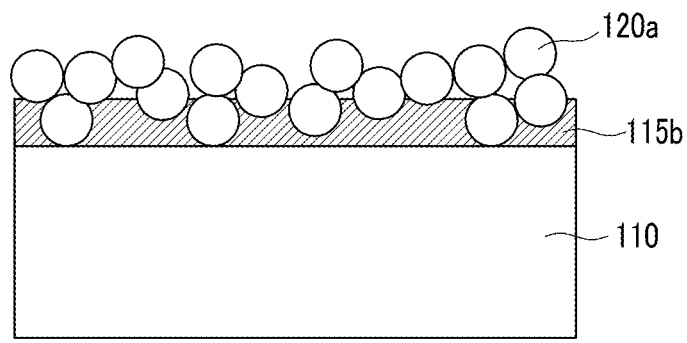

Referring to FIG. 3B, the temperature is increased to a temperature higher than the glass transition temperature Tg of the metallic glass 115a. In the exemplary embodiment wherein the metallic glass 115a includes Cu$_{50}$Zr$_{40}$Al$_{10}$, the glass transition temperature Tg may range from about 450° C. to about 500° C. The metallic glass 115b that is softened at a higher temperature than the glass transition temperature Tg may have wettability to contact the semiconductor substrate 110, and therefore closely contacts the semiconductor substrate 110. When the softened metallic glass 115b has low viscosity, it may have high wettability, and therefore may increase the close contacting property thereof.

Figure 3C:
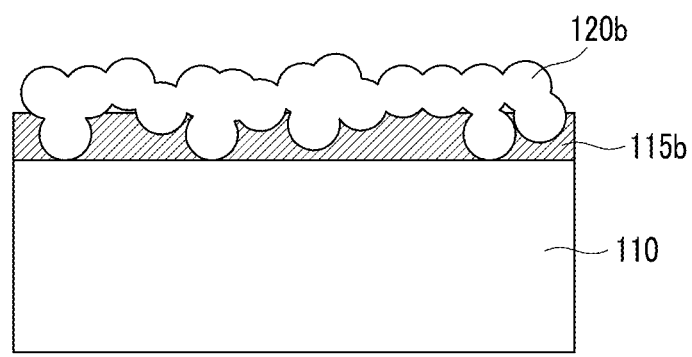

Referring to FIG. 3C, the temperature is increased to a temperature higher than a sintering temperature Ts of the conductive powder 120a. In the exemplary embodiment wherein the conductive powder 120a is silver (Ag), the sintering temperature Ts may range from about 580° C. to about 700° C. The adjacent conductive powder 120a may provide a firmly fastened and sintered conductive powder 120b at a temperature higher than the sintering temperature Ts. The metallic glass may exist as a solid, a supercooled liquid, or a liquid at the sintering temperature of the conductive powder 120a.

Figure 3D:
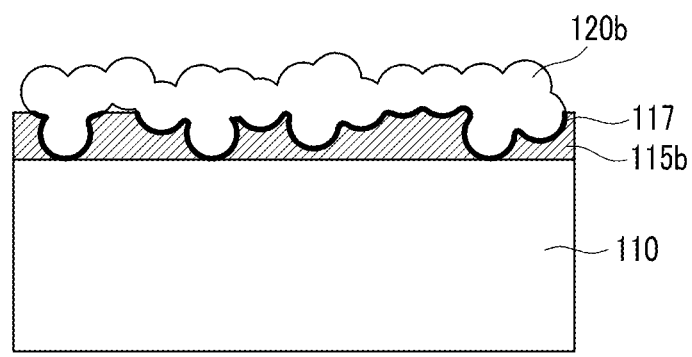

Referring to FIG. 3D, temperature is increased to be greater than the eutectic temperature T1 of a sintered conductive powder 120b and the softened metallic glass 115b. In the exemplary embodiment wherein the conductive powder 120b is silver (Ag) and the metallic glass 115b is Cu$_{50}$Zr$_{40}$Al$_{10}$, the eutectic temperature may be about 780° C. The conductive powder 120b and the metallic glass 115b may be an eutectic mixture having an increased close contacting property, and the first eutectic layer 117 may be disposed between them.

Figure 3E:
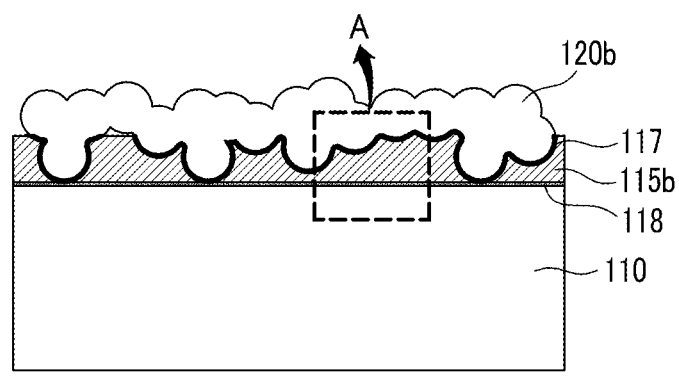
Figure 3F:
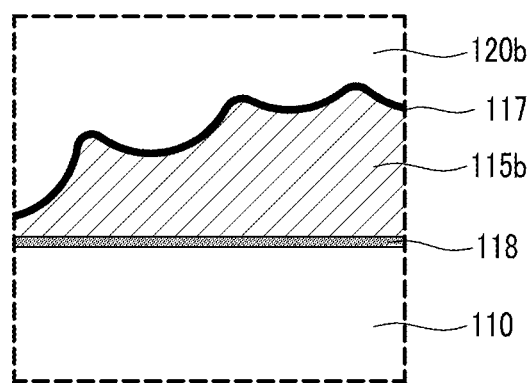

Referring to FIGS. 3E and 3F, wherein FIG. 3F is an enlarged view of Section 'A' (as indicated by dashed lines) shown in FIG. 3E. the temperature is increased to higher than the eutectic temperature T2 of the softened metallic glass 115b and the semiconductor substrate 110. In the exemplary embodiment wherein the metallic glass 115b includes Cu$_{50}$Zr$_{40}$Al$_{10}$ and the semiconductor substrate 110 includes silicon, the eutectic temperature may be about 802° C. The metallic glass 115b and the semiconductor substrate 110 may be an eutectic mixture having an increased close contacting property, and the second eutectic layer 118 may be disposed between them.

The softened metallic glass 115b may provide a buffer layer 115 by being crystallized at a certain temperature, and the buffer layer 115 may prevent the conductive powder 120b from diffusing into the semiconductor substrate 110.

In the present exemplary embodiment, a semiconductor substrate and an electrode are electrically connected to each other using a conductive metallic glass. Thereby, loss of electric charges is decreased by enlarging the path for transferring the electric charges to the electrode from the semiconductor substrate, and a buffer layer including the metallic glass may prevent a conductive material of the electrode from deleteriously diffusing into the semiconductor substrate.

Meanwhile, as mentioned above, exemplary embodiments of the conductive paste may further include glass frit. The glass frit may show a similar behavior as a metallic glass to form a part of a buffer layer and an eutectic layer.

Figure 4:
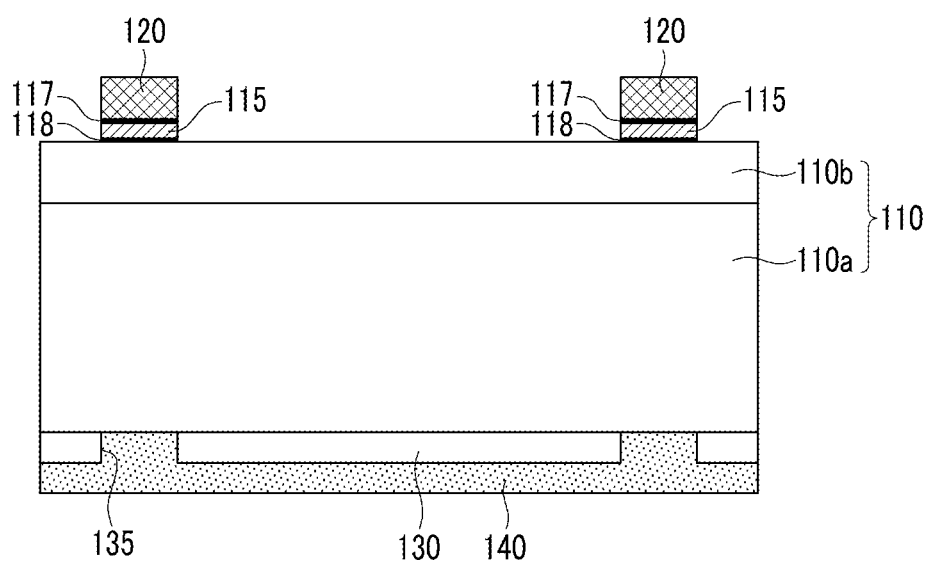
FIG. 4 is a cross-sectional view of an exemplary embodiment of a solar cell according to the present invention.

Referring to FIG. 4, another exemplary embodiment of a solar cell according to the present invention is described in detail.

FIG. 4 is a cross-sectional view of an exemplary embodiment of a solar cell according to the present invention.

Hereinafter, positions of components will be described with respect to a vertical relation to a semiconductor substrate 110 for better understanding and ease of description, but the present invention is not limited thereto. In addition, as used herein a solar energy incident side of a semiconductor substrate 110 is called a front side, and the opposite side is called a rear side; although alternative configurations are possible.

Referring to FIG. 4, the exemplary embodiment of a solar cell according to the present invention may include a semiconductor substrate 110 including a lower semiconductor layer 110a and an upper semiconductor layer 110b. Exemplary embodiments of the semiconductor substrate 110 may be formed of a crystalline silicon or a compound semiconductor. Exemplary embodiments of the crystalline silicon may be, for example, a silicon wafer. One of the lower semiconductor layer 110a and the upper semiconductor layer 110b may be a semiconductor layer doped with a p-type impurity, and the other may be a semiconductor layer doped with an n-type impurity. For example, in one exemplary embodiment the lower semiconductor layer 110a may be a semiconductor layer doped with a p-type impurity, and the upper semiconductor layer 110b may be a semiconductor layer doped with an n-type impurity. Herein, in one exemplary embodiment the p-type impurity may be a Group III element such as boron (B), and the n-type impurity may be a Group V element such as phosphorus (P).

In one exemplary embodiment, the surface of the upper semiconductor layer 110b may be subjected to surface texturing. The surface-textured upper semiconductor layer 110b may have protrusions and depressions such as in a pyramid shape, or a porous structure such as a honeycomb or various other similar shapes. The surface-textured upper semiconductor layer 110b may have an enlarged surface area to enhance the light-absorption rate and decrease reflectivity, resultantly improving efficiency of a solar cell.

A plurality of front electrodes 120 are disposed on the semiconductor layer 110b. The front electrodes 120 are arranged substantially in parallel to the plane of the substrate, and may be designed in a grid pattern with respect to shadowing loss and sheet resistance of the resulting solar cell.

In one exemplary embodiment, the front electrode portion 120 may be formed of a conductive material, for example a low resistance conductive material such as silver (Ag). The front electrode 120 may be disposed by a screen printing process using the conductive paste as described above. As mentioned above, the conductive paste includes a conductive powder, a metallic glass, and an organic vehicle.

A buffer layer 115 is disposed between the upper semiconductor layer 110b and the front electrode 120. The buffer layer 115 is a layer formed by softening the metallic glass in the conductive paste at a temperature greater than a glass transition temperature Tg of the metallic glass. Since the buffer layer 115 has conductivity due to the metallic glass and has parts that contact the electrode 120 and the upper semiconductor layer 110b, it may decrease loss of electric charges by enlarging the path for transferring electric charges between the upper semiconductor layer 110b and the front electrode 120. In addition, the buffer layer 115 may prevent a material of the front electrode 120 from deleteriously diffusing into the semiconductor substrate 110.

A first eutectic layer 117 is disposed between the front electrode 120 and the buffer layer 115, and a second eutectic layer 118 is disposed between the buffer layer 115 and the upper semiconductor layer 110b. The first eutectic layer 117 includes an eutectic mixture of the conductive material included in the front electrode 120 and the metallic glass included in the buffer layer 115, and the second eutectic layer 118 includes an eutectic mixture of the metallic glass included in the buffer layer 115 and the semiconductor material included in the upper semiconductor layer 110b.

In an exemplary embodiment wherein the solar cell is part of a larger solar array, a bus bar electrode (not shown) may be disposed on the front electrode 120. The bus bar electrode connects adjacent solar cells during assembly of a plurality of solar cells.

A dielectric layer 130 is disposed under the semiconductor substrate 110. The dielectric layer 130 may increase efficiency of a solar cell by preventing recombination of electric charges and leaking of a current. The dielectric layer 130 may include a plurality of penetration parts 135, and the semiconductor substrate 110 and a rear electrode 140 that will be described in more detail below may contact one another through the penetration parts 135.

In one exemplary embodiment, the dielectric layer 130 may be formed with silicon oxide ($SiO_2$), silicon nitride ($SiN_x$), aluminum oxide ($Al_2O_3$), a combination thereof or other materials with similar characteristics, and may have a thickness of about 100 Å to about 2000 Å.

A rear electrode 140 is disposed under the dielectric layer 130. The rear electrode 140 may be formed of a conductive material, and in one exemplary embodiment it may be an opaque metal such as aluminum (Al). The rear electrode 140 may be disposed by a screen printing process using the above-mentioned conductive paste in the same manner as the front electrode 120.

In one exemplary embodiment, a buffer layer (not shown) is disposed between the rear electrode 140 and the lower semiconductor layer 110a in the same manner as the front electrode 120. Further, a first eutectic layer (not shown) is disposed between the rear electrode 140 and the buffer layer, and a second eutectic layer (not shown) is disposed between the lower semiconductor layer 110a and the buffer layer in the same manner as the front electrode 120. Hereinafter, an exemplary embodiment of the conductive paste used for manufacturing the exemplary embodiment of a solar cell will be described in more detail.

Hereinafter, an exemplary embodiment of a method of manufacturing an exemplary embodiment of a solar cell using the conductive paste will be described with reference to FIG. 4.

First, a semiconductor substrate 110 such as a silicon wafer is prepared. In one exemplary embodiment, the semiconductor substrate 110 may be doped with a p-type impurity.

Then the semiconductor substrate 110 is subjected to a surface texturing treatment. Exemplary embodiments of the surface-texturing treatment may be performed by a wet method using a strong acid such as nitric acid and hydrofluoric acid or a strong base such as sodium hydroxide, or by a dry method using plasma.

Then, in one exemplary embodiment the semiconductor substrate 110 may be doped with an n-type impurity. The n-type impurity may be doped by diffusing $POCl_3$ or $H_3PO_4$ or the like into the semiconductor substrate 110 at a high temperature. Thus, the semiconductor substrate 110 includes a lower semiconductor layer 110a and an upper semiconductor layer 110b doped with different impurities from each other.

Then a conductive paste for a front electrode is applied on the upper semiconductor layer 110b. The conductive paste for a front electrode may be provided by a screen printing method. The screen printing method includes applying a front electrode conductive paste including a conductive powder such as silver (Ag), a metallic glass, and an organic vehicle on the position where a front electrode is positioned, and drying the same.

As described above, a conductive paste may include a metallic glass, and the metallic glass may be prepared using any kind of method such as melt spinning, infiltration casting, gas atomization, ion irradiation, mechanical alloying or other similar methods.

Then the conductive paste for forming a front electrode is dried.

A dielectric layer 130 may be provided by stacking aluminum oxide ($Al_2O_3$) or silicon oxide ($SiO_2$) on the rear side of the semiconductor substrate 110, as an example, by a plasma enhanced chemical vapor deposition ("PECVD") method or other similar methods.

Then, in one exemplary embodiment, a plurality of penetration parts 135 may be provided on one part of the dielectric layer 130 using a laser.

The conductive paste for forming a rear electrode is subsequently applied on one side of the dielectric layer 130, e.g., by a screen printing.

The conductive paste for forming a rear electrode is then dried.

Next, in the present exemplary embodiment the conductive paste for forming a front electrode and the conductive paste for forming a rear electrode are co-fired. However, alternative exemplary embodiments include configurations wherein the conductive paste for a front electrode and the conductive paste for a rear electrode may be respectively fired.

The firing may be performed at a higher temperature than the melting temperature of the conductive metal in a furnace, for example at a temperature ranging from about 400° C. to about 1000° C.

Hereinafter, another exemplary embodiment of a solar cell according to the present invention is described referring to FIG. 5.

Figure 5:
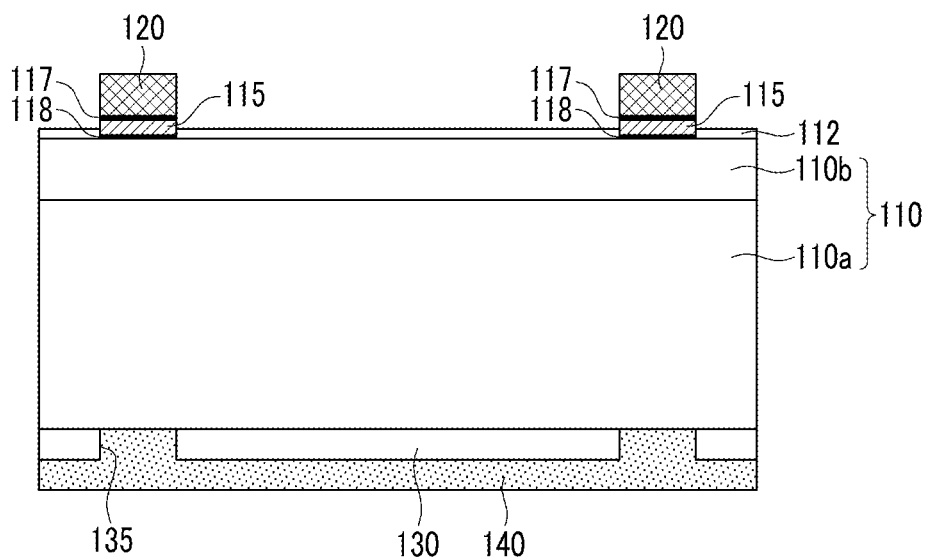
FIG. 5 is a cross-sectional view of another exemplary embodiment of a solar cell according to the present invention.

FIG. 5 is a cross-sectional view showing another exemplary embodiment of a solar cell according to the present invention.

Referring to FIG. 5, an exemplary embodiment of a solar cell according to the present invention includes, as described with respect to the above-mentioned embodiment, a semiconductor substrate 110 including lower semiconductor layer 110a and upper semiconductor layer 110b; a plurality of front electrodes including a buffer layer 115 positioned between an upper semiconductor layer 110b and the front electrodes 120; a first eutectic layer 117 positioned between the front electrode 120 and the buffer layer 115; a second eutectic layer 118 positioned between the upper semiconductor layer 110b and the buffer layer 115; a dielectric layer 130 positioned under the semiconductor substrate 110; and a rear electrode 140 positioned under the dielectric layer 130.

However, the solar cell according to the present embodiment, unlike the above-mentioned embodiment, includes an insulating layer 112 covering the entire surface of the semiconductor substrate 110 except the regions corresponding to the buffer layer 115 as described in more detail below.

Exemplary embodiments of the insulating layer 112 may be made of insulating material that absorbs relatively little light, for example, silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), a combination thereof, or other materials with similar characteristics. Exemplary embodiments of the insulating layer 112 include a single layer configuration and a multiple layer configuration.

In one exemplary embodiment, the insulating layer 112 may have a thickness ranging from about 200 Å to about 1500 Å.

The insulating layer 112 may decrease the reflection rate of light and increase selectivity of a particular wavelength or a particular range of wavelengths on the front side of the solar cell to serve as an anti-reflective coating ("ARC"). The insulating layer 112 may be manufactured from a material that is effective to improve its contact properties with the silicon in the surface of the semiconductor substrate 110, thereby increasing the efficiency of the solar cell.

The front electrodes 120 may penetrate the insulating layer 112 to contact the upper semiconductor layer 110b. The contacting part of the front electrode 120 and the upper semiconductor layer 110b may be removed by etching, and the etching may be carried out by using the conductive paste further including glass frit with the conductive powder, the metallic glass and the organic vehicle. The glass frit may have an etching property with respect to the insulating layer 112.

The glass frit may act as the metallic glass, and by further including the glass frit with metallic glass, it may improve adhesion to a lower layer.

Hereinafter, another exemplary embodiment of a solar cell according to the present invention is described referring to FIG. 6.

Figure 6:
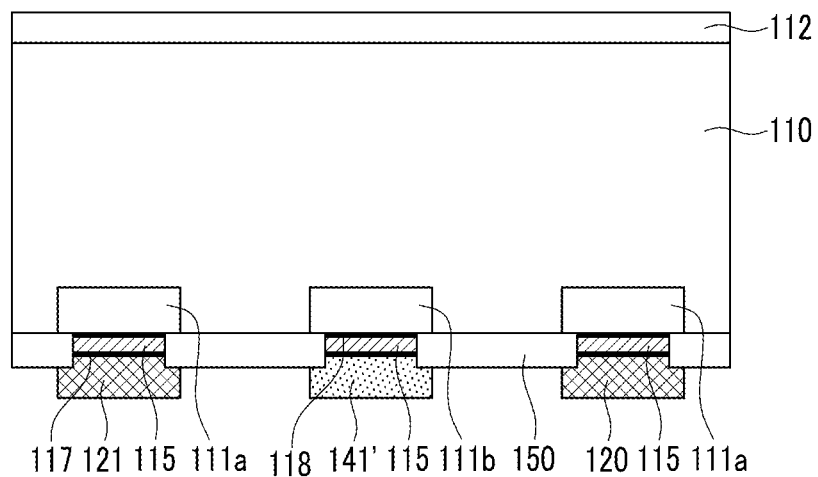
FIG. 6 is a cross-sectional view of another exemplary embodiment of a solar cell according to the present invention.

FIG. 6 is a cross-sectional view showing another exemplary embodiment of a solar cell according to the present invention.

The present exemplary embodiment of a solar cell may include a semiconductor substrate 110 doped with a p-type or an n-type impurity. The semiconductor substrate 110 may include a plurality of first doping regions 111a and second doping regions 111b that are provided on the rear side and are doped with different impurities from each other. For example, in one exemplary embodiment the first doping regions 111a may be doped with an n-type impurity, and the second doping regions 111b may be doped with a p-type impurity. The first doping regions 111a and the second doping regions 111b may be alternately disposed in the rear side of the semiconductor substrate 110.

The front side of the semiconductor substrate 110 may be surface-textured, and therefore may enhance the light-absorption rate and decrease the reflectivity thereof, resultantly improving efficiency of a resulting solar cell. In the present exemplary embodiment, an insulation layer 112 is provided on the semiconductor substrate 110.

A dielectric layer 150 including a plurality of penetration parts may be disposed on the rear side of the semiconductor substrate 110.

The first electrode 121 connected with the first doping region 111a and the second electrode 141 connected with the second doping region 111b are disposed on the rear side of the semiconductor substrate 110, respectively. The first electrode 121 and the first doping region 111a may be contacted with one another through a penetration part, and the second electrode 141 and the second doping region 111b may be contacted with one another through a penetration part. The first electrode 121 and the second electrode 141 may be alternately disposed with one another.

As described in the above exemplary embodiment, the first electrode 121 and the second electrode 141 may be disposed on the semiconductor 110 using a conductive paste including a conductive powder, a metallic glass, an organic vehicle, and optionally glass frit, which is substantially the same as described above.

A buffer layer 115 is disposed between the first doping region 111a and the first electrode 121, and/or between the second doping region 111b and the second electrode 141. The buffer layer 115 may have conductivity due to a metallic glass used in the formation thereof. Since the buffer layer 115 includes parts contacting the first electrode 121 and/or the second electrode 141 and parts contacting the first doping region 111a and/or the second doping region 111b, loss of electric charges may decrease by enlarging the path for charge transfer between the first doping region 111a and the first electrode 121, and/or between the second doping region 111b and the second electrode 141. In addition, the buffer layer 115 may prevent a material of the first electrode 121 or the second electrode 141 from deleteriously diffusing into the first or second doping region 111a or 111b.

A first eutectic layer 117 including an eutectic mixture of a conductive material of the first electrode 121 or the second electrode 141, and a metallic glass of the buffer layer 115, is disposed between the first electrode 121 or the second electrode 141 and the buffer layer 115. A second eutectic layer 118 including an eutectic mixture of a semiconductor material and a metallic glass is disposed between the first or second doping region 111a or 111b and the buffer layer 115.

An exemplary embodiment of a solar cell including both of the first electrode 121 and the second electrode 141 on the rear surface of the solar cell may decrease an area where a metal is positioned on the front, i.e., light incident, surface of the solar cell. This may decrease shadowing loss and increase solar cell efficiency.

Hereinafter, an exemplary embodiment of a method of manufacturing an exemplary embodiment of a solar cell will be described.

First, a semiconductor substrate 110 doped with, for example, an n-type impurity is prepared. Then, the semiconductor substrate 110 is surface-textured, and insulation layer 112 and dielectric layer 150 are disposed on front side and rear side of the semiconductor substrate 110, respectively. The insulation layer 112 and the dielectric layer 150, as an example, may be provided by chemical vapor deposition ("CVD").

Then, a part of the dielectric layer 150 is removed by, for example, using a laser to form a plurality of openings.

The first doping region 111a and the second doping region 111b may be disposed by sequentially doping a p-type impurity and an n-type impurity at a high concentration in the openings at rear side of the semiconductor substrate 110.

Then, a conductive paste for forming a first electrode 121 is applied on one side of the dielectric layer 150 corresponding to the first doping region 111a, and a conductive paste for forming a second electrode is applied on the other side corresponding to the second doping region 111b. The conductive paste for forming a first electrode and the conductive paste for forming a second electrode are provided by a screen printing process, and the conductive paste including a conductive powder, a metallic glass, an organic vehicle, and optionally glass frit may be respectively used.

Next, the conductive paste for forming a front electrode and the conductive paste for forming a rear electrode may be fired together or respectively. The firing may be performed at a higher temperature than the melting temperature of a conductive metal in a furnace.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductive paste comprising:
   a conductive powder;
   a metallic glass, the metallic glass including an alloy having a disordered atomic structure, the metallic glass including a glass transition temperature (Tg) and a supercooled liquid region (SCL), the metallic glass configured to be softened when heated above the Tg of the metallic glass and below a crystallization temperature (Tx) of the metallic glass; and
   an organic vehicle.

2. The conductive paste of claim 1, wherein the conductive paste comprises about 50 wt % to about 90 wt % of the conductive powder, about 1 wt % to about 20 wt % of the metallic glass, and a remaining amount of the organic vehicle based on a total amount of the conductive paste.

3. A conductive paste comprising:
   a conductive powder;
   a metallic glass, the metallic glass including an alloy having a disordered atomic structure that includes at least two metals, the metallic glass including a glass transition temperature (Tg) and a supercooled liquid region (SCL), the metallic glass configured to be softened when heated above the Tg of the metallic glass and below a crystallization temperature (Tx) of the metallic glass; and
   an organic vehicle.

4. The conductive paste of claim 3, wherein the metallic glass comprises at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tan), and a combination thereof.

5. The conductive paste of claim 4, wherein the alloy of the metallic glass comprises at least one of copper (Cu), zirconium (Zr), nickel (Ni), iron (Fe), titanium (Ti), magnesium (Mg), and a combination thereof.

6. The conductive paste of claim 3, wherein a glass transition temperature of the metallic glass is lower than a eutectic temperature of silicon and the conductive powder.

7. The conductive paste of claim 6, wherein an eutectic temperature of the conductive powder and the metallic glass is lower than a eutectic temperature of the silicon and the conductive powder.

8. The conductive paste of claim 6, wherein an eutectic temperature of the silicon and the metallic glass is lower than a eutectic temperature of the silicon and the conductive powder.

9. The conductive paste of claim 3, wherein the metallic glass is one of a solid, a supercooled liquid, and a liquid at a sintering temperature of the conductive powder.

10. The conductive paste of claim 3, wherein the conductive powder comprises at least one of silver (Ag), aluminum (Al), copper (Cu), nickel (Ni), and a combination thereof.

11. The conductive paste of claim 3, wherein the conductive paste comprises about 50 wt % to about 90 wt % of the conductive powder, about 1 wt % to about 20 wt % of the metallic glass, and a remaining amount of the organic vehicle based on a total amount of the conductive paste.

12. The conductive paste of claim 3, further comprising glass frit.

13. The conductive paste of claim 12, wherein the conductive paste comprises about 50 wt % to about 90 wt % of the conductive powder, about 1 wt % to about 20 wt % of the metallic glass, about 1 wt % to 10 wt % of the glass frit, and a remaining amount of the organic vehicle based on a total amount of the conductive paste.

14. The conductive past of claim 3, wherein the alloy of the metallic glass includes two to six metals.

15. The conductive paste of claim 3, wherein
the conductive powder comprises at least one of silver (Ag), aluminum (Al), copper (Cu), nickel (Ni), and a combination thereof; and
a glass transition temperature of the metallic glass is lower than a eutectic temperature of silicon and the conductive powder.

16. The conductive paste of claim 3, wherein
the conductive powder comprises at least one of silver (Ag), aluminum (Al), copper (Cu), nickel (Ni), and a combination thereof;
an eutectic temperature of the conductive powder and the metallic glass is lower than a eutectic temperature of silicon and the conductive powder.

17. The conductive paste of claim 3, wherein
the alloy of the metallic glass comprises at least one of copper (Cu), zirconium (Zr), nickel (Ni), iron (Fe), titanium (Ti), magnesium (Mg), and a combination thereof; and
an eutectic temperature of silicon and the metallic glass is lower than a eutectic temperature of silicon and the conductive powder.

18. A solar cell comprising:
a semiconductor layer comprising a semiconductor material; and
an electrode prepared by using the conductive paste of claim 3 and electrically connected to the semiconductor layer.

19. The solar cell of claim 18, wherein the conductive paste further comprises glass frit.

20. The solar cell of claim 18, wherein a glass transition temperature of the metallic glass is lower than a eutectic temperature of the semiconductor material and the conductive powder.

21. The solar cell of claim 20, wherein
electrode comprises a buffer layer, and
the buffer layer further comprises glass frit.

22. The solar cell of claim 18, wherein an eutectic temperature of the conductive powder and the metallic glass is lower than a eutectic temperature of the semiconductor material and the conductive powder.

23. The solar cell of claim 18, wherein an eutectic temperature of the semiconductor material and the metallic glass is lower than a eutectic temperature of the semiconductor material and the conductive powder.

24. The solar cell of claim 18, wherein the semiconductor material comprises silicon.

25. The solar cell of claim 18, wherein the metallic glass includes at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tin), and a combination thereof.

26. The solar cell of claim 18, wherein the conductive powder comprises at least one of silver (Ag), aluminum (Al), copper (Cu), nickel (Ni), and a combination thereof.

27. The solar cell of claim 18, wherein the semiconductor layer comprises a p-type layer doped with a p-type impurity and an n-type layer doped with an n-type impurity.

28. The solar cell of claim 27, wherein the electrode comprises a first electrode electrically connected with the p-type layer and a second electrode electrically connected with the n-type layer.

29. The solar cell of claim 18, wherein
the electrode comprises an electrode portion including the conductive material and a buffer layer,
the buffer layer is formed from the metallic glass and, and
the buffer layer is positioned at a region which is adjacent to the semiconductor layer.

30. A conductive paste comprising:
a conductive powder;
a metallic glass,
the metallic glass including an alloy having a disordered atomic structure that includes two to six different elements selected independently from the group consisting of transition metals, a noble metal, a rare earth metal, an alkaline-earth metal, a semimetal, and a metalloid, the metallic glass including a glass transition temperature (Tg) and a supercooled liquid region (SCL), the metallic glass configured to be softened when heated above the Tg of the metallic glass and below a crystallization temperature (Tx) of the metallic glass; and
an organic vehicle.

31. The conductive paste of claim 30, wherein the metallic glass comprises at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorus (P), boron (B), silicon (Si), carbon (C), tin (Sn), zinc (Zn), molybdenum (Mo), tungsten (Ml), manganese (Mn), erbium (Er), chromium (Cr), praseodymium (Pr), thulium (Tm), and a combination thereof.

32. The conductive paste of claim 31, wherein the alloy of the metallic glass comprises at least one of copper (Cu), zirconium (Zr), nickel (Ni), iron (Fe), titanium (Ti), magnesium (Mg), and a combination thereof.

33. The conductive paste of claim 30, wherein the conductive powder comprises at least one of silver (Ag), aluminum (Al), copper (Cu), nickel (Ni), and a combination thereof.

34. The conductive paste of claim 30, wherein the conductive paste comprises about 50 wt % to about 90 wt % of the conductive powder, about 1 wt % to about 20 wt % of the metallic glass, and a remaining amount of the organic vehicle based on a total amount of the conductive paste.

* * * * *